US006509825B1

United States Patent
Smit et al.

(10) Patent No.: US 6,509,825 B1
(45) Date of Patent: Jan. 21, 2003

(54) INTEGRATED CIRCUIT DEVICE HAVING A SELF-BIASED, SINGLE PIN RADIO FREQUENCY SIGNAL INPUT

(75) Inventors: Willem Smit, Chandler, AZ (US); Pieter Schieke, Phoenix, AZ (US); Willem J. Marneweck, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/405,451

(22) Filed: Sep. 24, 1999

(51) Int. Cl.[7] .................. G05B 19/00; G08B 13/14

(52) U.S. Cl. ............... 340/5.2; 340/5.61; 340/10.4; 340/10.1; 340/572.5; 342/51; 235/382

(58) Field of Search .................. 340/5.2, 5.6, 5.61, 340/10.4, 572.1, 572.5, 572.8, 825.69, 825.72, 10.1, 10.3; 342/30, 51; 235/382

(56) References Cited

U.S. PATENT DOCUMENTS

| 5,606,323 A | * | 2/1997 | Heinrich et al. ............... 342/51 |
| 5,657,359 A | * | 8/1997 | Sakae et al. ................. 375/376 |
| 5,686,864 A | * | 11/1997 | Martin et al. ................ 331/179 |
| 6,130,602 A | * | 10/2000 | O'Toole et al. .......... 340/10.33 |

* cited by examiner

Primary Examiner—Donnie L. Crosland
(74) Attorney, Agent, or Firm—Baker Botts L.L.P.

(57) ABSTRACT

A radio frequency transponder device in an integrated circuit package requires only one dedicated pin for connection to a parallel resonant tuned circuit for receiving a remote signal. The one dedicated pin has a capacitor which blocks direct current (DC) flow and allows independent DC biasing of a radio frequency amplifier for increased signal amplification gain. Another package pin used for common power or ground connections supplies the second connection to the resonant tuned circuit. Multiple transponder inputs may be implemented in a single integrated circuit package using only one dedicated pin per input plus one common pin which may be used for another purpose, such as a power or a ground connection.

21 Claims, 6 Drawing Sheets

INTEGRATED CIRCUIT DEVICE HAVING A SELF-BIASED, SINGLE PIN RADIO FREQUENCY SIGNAL INPUT

BACKGROUND OF THE INVENTION

This invention relates generally to integrated circuit radio frequency transponders, and more particularly, to an integrated circuit radio frequency transponder requiring only one dedicated input pin for signal connection to an externally connected resonant frequency tuned circuit.

DESCRIPTION OF THE RELATED TECHNOLOGY

Radio frequency transponders may be used in managing inventory, automatic identification of cars on toll roads, building entry, security systems, keyless electronic access and entry devices, and the like. A transponder generally comprises a radio frequency receiver and a radio frequency transmitter and communicates with another related transponder by either first receiving a coded signal and then responding back with a coded transmitted signal, or transmitting a coded signal first then waiting for the correct response to be returned from the related transponder. Any combination of coded signal "handshakes" may be utilized by two transponders trying to identify a "friend" or "foe." Once a friendly coded signal is identified and verified a desired action may be taken, i.e., unlocking a car door, opening a garage door, or building access or egress.

An example of a transponder system is the KEELOQ® (a registered trademark of Microchip Technology Inc.) Code Hopping Encoder and Transponder, part number HCS412 by Microchip Technology Inc., more fully described in Specification DS41099A (1999), available at http://www.microchip.com, and incorporated by reference herein.

Typically, the transponder amplitude modulates a CW RF carrier of an RF generator with a data word bitstream in accordance with the binary values of that data word bitstream. The data word bitstream is a series of on/off pulses which represent, for example, a serial data word synchronization header, a tag number, etc. Parity bits or a checksum value may also be incorporated into the data word bitstream. These series of on/off pulses are received by the related transponder.

Heretofore, a parallel resonant tuned circuit required connection to two pins of an integrated circuit transponder system. In an integrated circuit package having, for example, multiple functions and/or a plurality of transponder circuits, input-output pin utilization is critical. Requiring two dedicated pins for each parallel resonant circuit associated with a transponder takes away the possibility of using the limited number of pins on the integrated circuit package for other needed or desired functions.

Therefore, what is needed is more effective and better utilization of input-output pins on an integrated circuit package for connecting a parallel resonant circuit to the transponder circuit of the integrated circuit.

SUMMARY OF THE INVENTION

The invention overcomes the above-identified problems as well as other shortcomings and deficiencies of existing technologies by providing in an integrated circuit package a transponder requiring only a single dedicated input-output pin (of the integrated circuit package) for connection (external to the package) to a resonant frequency tuned circuit. Another package pin which may be used for common power or ground connections may supply the second connection to the resonant frequency tuned circuit. The transponder embodiment of the present invention may be used in security and access devices for unlocking and opening automobile doors, home and office doors, garage doors, security gates and the like. The present invention enables hands-free operation of locks, doors and the like. Since the transponder is able to receive a low power radio frequency signal, verification and activation of the lock or door may occur from a distance and without having to remove the transponder system from ones pocket, purse, or briefcase.

It is contemplated herein and within the scope of the present invention that an integrated circuit package comprises a plurality of transponder circuits connected to a plurality of associated resonant frequency tuned circuits, each of the plurality of associated resonant frequency tuned circuits requiring a first connection to only a single dedicated input-output pin, and a second connection to a common pin.

It is also contemplated herein and within the scope of the present invention that the dedicated resonant frequency tuned circuit input-output pin(s) may also be used for a secondary function (i.e., dual purpose).

In accordance with an embodiment of the present invention, an integrated circuit package having a transponder circuit therein, has an input-output pin connected to an input of a high gain amplifier biased with current sources also connected to the input of the high gain amplifier. A direct current (DC) bias level measurement and control circuit may be connected to and be in control of these current sources. An input to the DC bias level measurement and control circuit may be a signal received at the input-output pin connected to the input of the high gain amplifier. From the amplitude of the measured input signal, the DC bias level measurement and control circuit may change the DC bias level of the high gain amplifier, thus controlling the gain thereof.

A parallel resonant circuit comprising an inductor connected in parallel with a capacitor forms a pickup sensor or antenna for an externally generated electromagnetic or radio frequency signal. One end of the parallel resonant circuit is connected to a common power or ground pin of the integrated circuit package and the other end of the parallel resonant circuit is connected to one end of a DC blocking capacitor. The other end of the DC blocking capacitor is connected to the input-output pin of the integrated circuit package which is also connected to the input of the high gain amplifier. The reactance of the DC blocking capacitor is preferably substantially less than the input impedance of the high gain amplifier (for example but not limitation: one tenth the impedance) and preferably may also be substantially less than the impedance of the parallel circuit at resonance (for example but not limitation: one tenth the impedance). The DC blocking capacitor thus allows an alternating current (AC) signal coupled to the parallel resonant circuit to pass to the input of the high gain amplifier without the parallel resonant circuit (DC low resistance) affecting the DC bias value from the current sources which are also connected to the input of the amplifier. Alternatively, a DC blocking capacitor may be connected in series with the inductor instead of between the parallel resonant circuit and the input-output pin of the integrated circuit package, and the parallel resonant circuit may then be connected directly to the input-output pin.

An internally generated signal for transmission may be applied to the same pin as used as an input to the transponder amplifier or a separate pin may be utilized to transmit the signal from the integrated circuit. Typical receive or input signal frequencies may be from about 100 kHz to about 14 MHz, and a transmitted output frequency may be from about 100 kHz to well into the ultra high frequency (UHF) range.

In another embodiment of the present invention, an integrated circuit package has a plurality of transponder circuits and a corresponding plurality of input-output pins, each transponder amplifier having an input connected to a one of the corresponding plurality of input-output pins. A plurality of parallel resonant circuits are adapted for connection to the corresponding plurality of input-output pins through DC blocking capacitors and to a common power or ground pin, or the DC blocking capacitors may be connected in series with the inductors, as disclosed above. The plurality of transponder amplifiers and plurality of parallel resonant circuits may be utilized with one signal frequency in a diversity receiving or voting system, or each one of the plurality of parallel resonant circuits may be tuned to a different frequency and the integrated circuit used as multiple simultaneous transponders. Internally generated transmit signals may be applied to the same pin and tuned circuit or may be applied to other pins of the integrated circuit package.

A feature of the present invention is using only one dedicated input-output pin on an integrated circuit package for each transponder function in an integrated circuit.

Another feature is a plurality of transponders in an integrated circuit having a minimum number of input-output pins.

Still another feature is a space diversity or voting system having a plurality of transponders.

An advantage of the present invention is a reduction of the number of input-output pins required for operation of a bi-directional transponder in an integrated circuit.

Another advantage is the operation of the transponder over a desired distance without having to remove the transponder system from a pocket, purse, briefcase and the like.

Features and advantages of the invention will be apparent from the following description of presently preferred embodiments, given for the purpose of disclosure and taken in conjunction with the accompanying drawings.

DETAILED DESCRIPTION OF THE PREFERRED EMBODIMENTS

Figure 1:
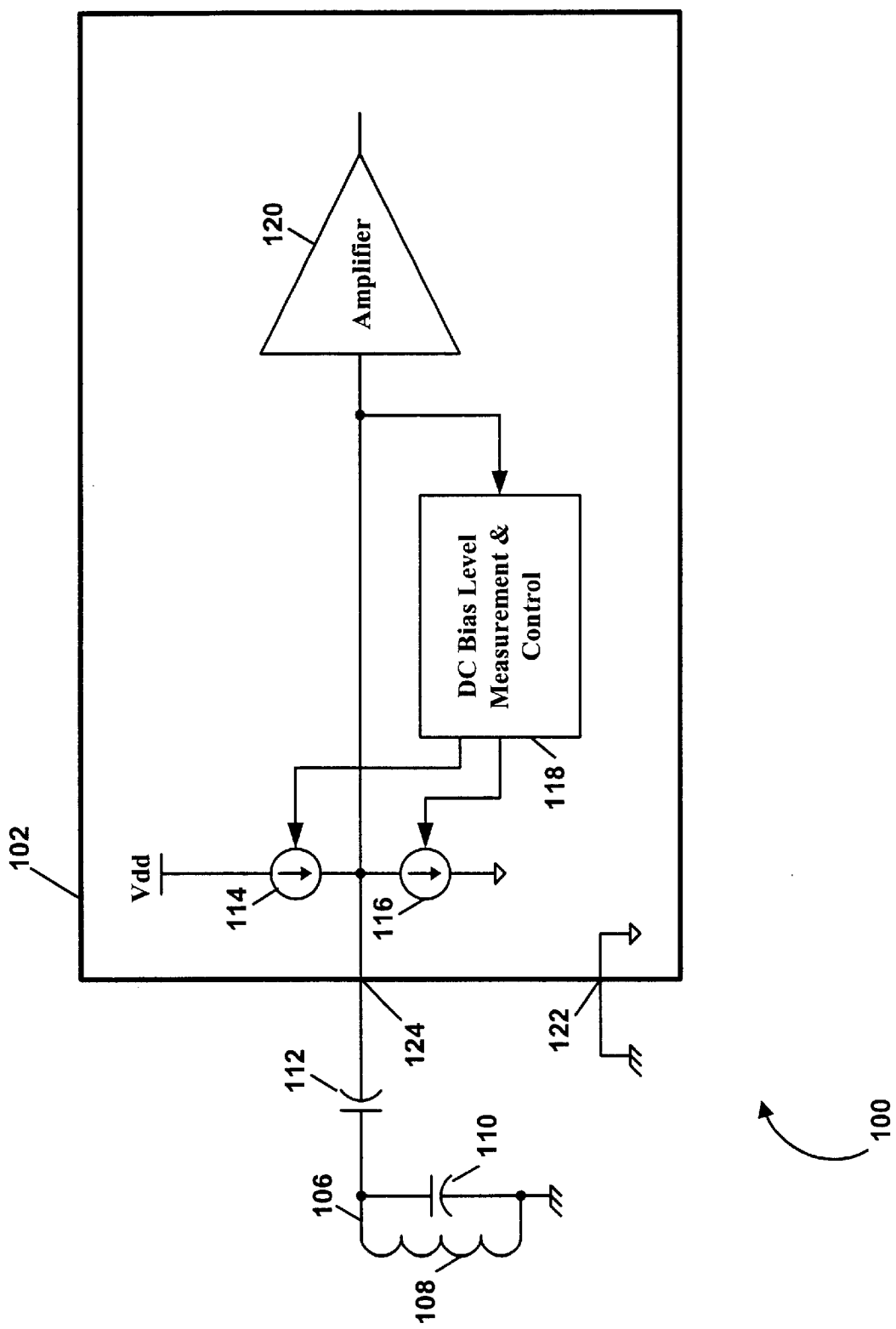
FIG. 1 is a schematic block diagram of an embodiment of the invention.

The invention is a radio frequency transponder in an integrated circuit package that uses a single dedicated input-output pin and a common power or ground pin (of the integrated circuit package) for connection (external to the package) to a resonant parallel connected inductor-capacitor tuned circuit. The present invention is especially useful in any application requiring not only secure communication of data and commands but also the protection of any valuable asset or property. For example but not limitation: (1) Vehicular applications comprising remote keyless entry, alarm systems, and immobilizers for cars and trucks. (2) Consumer and commercial applications comprising car alarms, garage door openers, burglar alarms, gate locks, door locks, and secure communications for smoke, carbon monoxide and radon detectors. (3) Industrial applications comprising package tracking, parts tracking, package and equipment tags, and identity tokens. The present invention enables hands-free operation of locks, doors, gates and the like. Since the transponder is able to receive a low power radio frequency signal, verification and activation of the lock of a door or gate opening mechanism may occur from a distance and without having to remove the transponder system from ones pocket, purse, or briefcase.

Referring now to the drawings, the details of preferred embodiments of the invention are schematically illustrated. Like elements in the drawings will be represented by like numbers, and similar elements will be represented by like numbers with a different lower case letter suffix.

Referring now to FIG. 1, a schematic block diagram of an embodiment of the invention, is illustrated. A transponder is generally indicated by the numeral 100. According to an embodiment of the present invention, the transponder 100 comprises a high gain signal amplifier 120, current sources 114 and 116, and a DC bias level measurement and control circuit 118 in an integrated circuit package 102; and a parallel tuned circuit 106 comprising a capacitor 110 and an inductor 108, and a DC blocking capacitor 112 connected between an input-output pin 124 of the integrated circuit package 102 and the parallel tuned circuit 106. The signal return of the parallel tuned circuit 106 is through a common power or ground pin 122 (ground pin illustrated). However, the use of a common power pin for a signal return is also contemplated and within the scope of the present invention).

The DC blocking capacitor 112 allows an independent DC bias level to be set at the input of the amplifier 120. The DC bias level measurement and control circuit 118 controls the current sources 114 and 116 so that a preferred DC bias value is applied to the amplifier 120 to optimize the available signal amplification thereof. The DC bias level measurement and control circuit 118 can also control the gain of the amplifier 120 by changing its DC bias value. The amplification of the amplifier 120 may be optimized to receive signals of 1 millivolt or greater.

The parallel tuned circuit 106 is adapted to receive electromagnetic or radio frequency (RF) energy from a signal source. The received energy is in the form of an alternating current (AC) signal which is coupled through the blocking capacitor 112 and amplified by the amplifier 120. The amplified signal from the output of the amplifier 120 is then detected (demodulated) as information for processing in logic circuits (not illustrated). The blocking capacitor 112 has an AC impedance substantially lower than the input impedance of the amplifier 120. Thus, the blocking capacitor 112 introduces very little attenuation of the received AC signal at the parallel tuned circuit 106.

Figure 2:
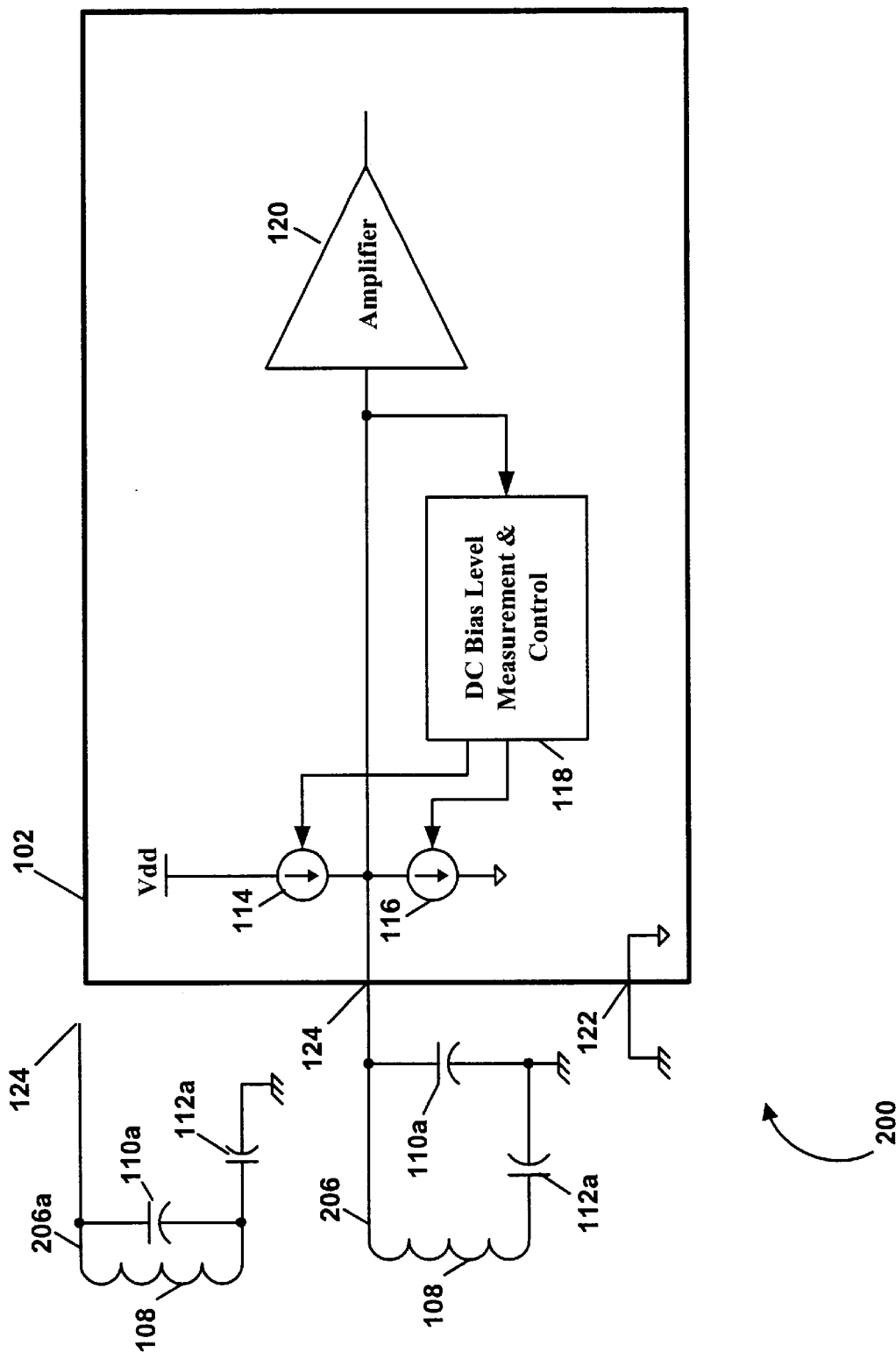
FIG. 2 is a schematic block diagram of another embodiment of the invention.

Referring now to FIG. 2, a schematic block diagram of another embodiment of the invention is illustrated. A transponder is generally indicated by the numeral 200. According to the embodiment of the present invention, the transponder 200 comprises a high gain signal amplifier 120, current sources 114 and 116, and a DC bias level measurement and control circuit 118 in an integrated circuit package 102; and a parallel tuned circuit 206 comprising a capacitor 110a, an inductor 108 and a DC blocking capacitor 112a connected in series with the inductor 108. The parallel tuned circuit 206 is connected to the input-output pin 124 of the integrated circuit package 102, and the signal return of the parallel tuned circuit 206 is through a common power or ground pin 122 (ground pin illustrated). However, the use of a common power pin for a signal return is also contemplated and within the scope of the present invention).

The DC blocking capacitor 112a allows an independent DC bias level to be set at the input of the amplifier 120, and the DC bias level measurement and control circuit 118 controls the current sources 114 and 116 as disclosed hereinabove. The parallel tuned circuit 206 is adapted to receive electromagnetic or radio frequency (RF) energy from a signal source. The received energy is in the form of an alternating current (AC) signal which is coupled through the blocking capacitor 112 and amplified by the amplifier 120. The amplified signal from the output of the amplifier 120 is then detected (demodulated) as information for processing in logic circuits (not illustrated). The blocking capacitor 112a has an AC impedance substantially lower than the input impedance of the amplifier 120 and the AC impedance of the capacitor 110a. Thus, the blocking capacitor 112 introduces very little attenuation of the received AC signal at the parallel tuned circuit 206 and does not materially affect the resonant frequency of the parallel tuned circuit 206. The blocking capacitor may also be connected between a parallel connected tuned circuit 206a and common or ground, as indicated in FIG. 2.

Figure 3:
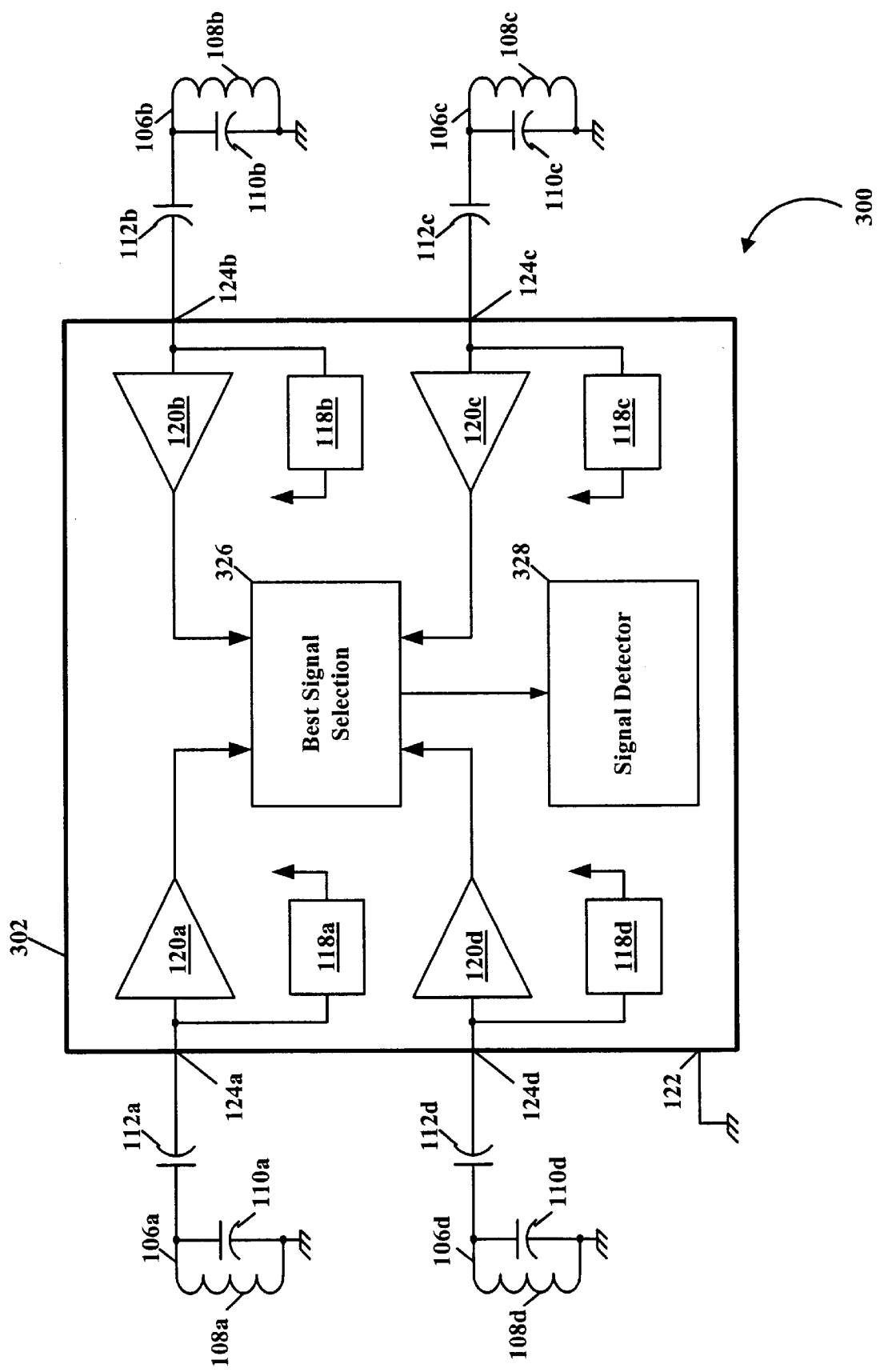
FIG. 3 is a schematic block diagram of a multiple input single channel embodiment of the invention.

Referring now to FIG. 3, a schematic block diagram of a multiple input single channel embodiment of the invention is illustrated. A transponder having a plurality of signal inputs is generally indicated by the numeral 300. According to this embodiment of the present invention, the transponder 300 comprises high gain signal amplifiers 120a–120d, DC bias level measurement and control circuits 118a–118d, (current sources 114a–114d and 116a–116d are not illustrated for clarity), a best signal selection circuit 326 and a signal detector 328 in an integrated circuit package 302; and parallel tuned circuits 106a–106d, and DC blocking capacitors 112a–112d connected between input-output pins 124a–124d of the integrated circuit package 302 and the parallel tuned circuits 106a 106d.

The parallel tuned circuits 106a–106d comprise capacitors 110a–110d and inductors 108a–108d. The signal returns of the parallel tuned circuits 106a–106d are through a common power or ground pin 122 (ground pin illustrated). However, the use of a common power pin for a signal return is also contemplated and within the scope of the present invention).

The DC blocking capacitors 112a–112d allow independent DC bias levels to be set at the inputs of each of the amplifiers 120a–120d. The DC bias level measurement and control circuits 118a–118d control the current sources 114a–114d and 116a–116d (not illustrated), respectively, so that preferred DC bias values are applied to the amplifiers 120a–120d to optimize the available signal amplification thereof The DC bias level measurement and control circuits 118a–118d can also control the gain of the amplifiers 120a–120d, respectively, by changing the respective DC bias values thereof. The amplification of the amplifiers 120a–120d may be optimized to receive signals of 1 millivolt or greater.

The parallel tuned circuits 106a–106d are adapted to receive electromagnetic or radio frequency (RF) energy from a signal source(s). The received energy is in the form of an alternating current (AC) signal which is coupled through the blocking capacitors 112a–112d and amplified by the amplifiers 120a–120d. The amplified signals from the outputs of the amplifiers 120a–120d are compared in the best signal selection circuit 326, wherein the best (i.e., strongest) signal is selected and then detected (demodulated) in the signal detector 328. The detected information is processed in logic circuits (not illustrated). The blocking capacitors 112a–112d each have an AC impedance substantially lower than the input impedance of the amplifiers 120a–120d. Thus, the blocking capacitors 112a–112d introduce very little attenuation of the received AC signals at the parallel tuned circuits 106a–106d. Four tuned circuits and amplifiers are illustrated for clarity, however, it is contemplated and within the scope of the present to invention that any number of tuned circuits and amplifiers may be utilized by the embodiment of the present invention.

Figure 4:
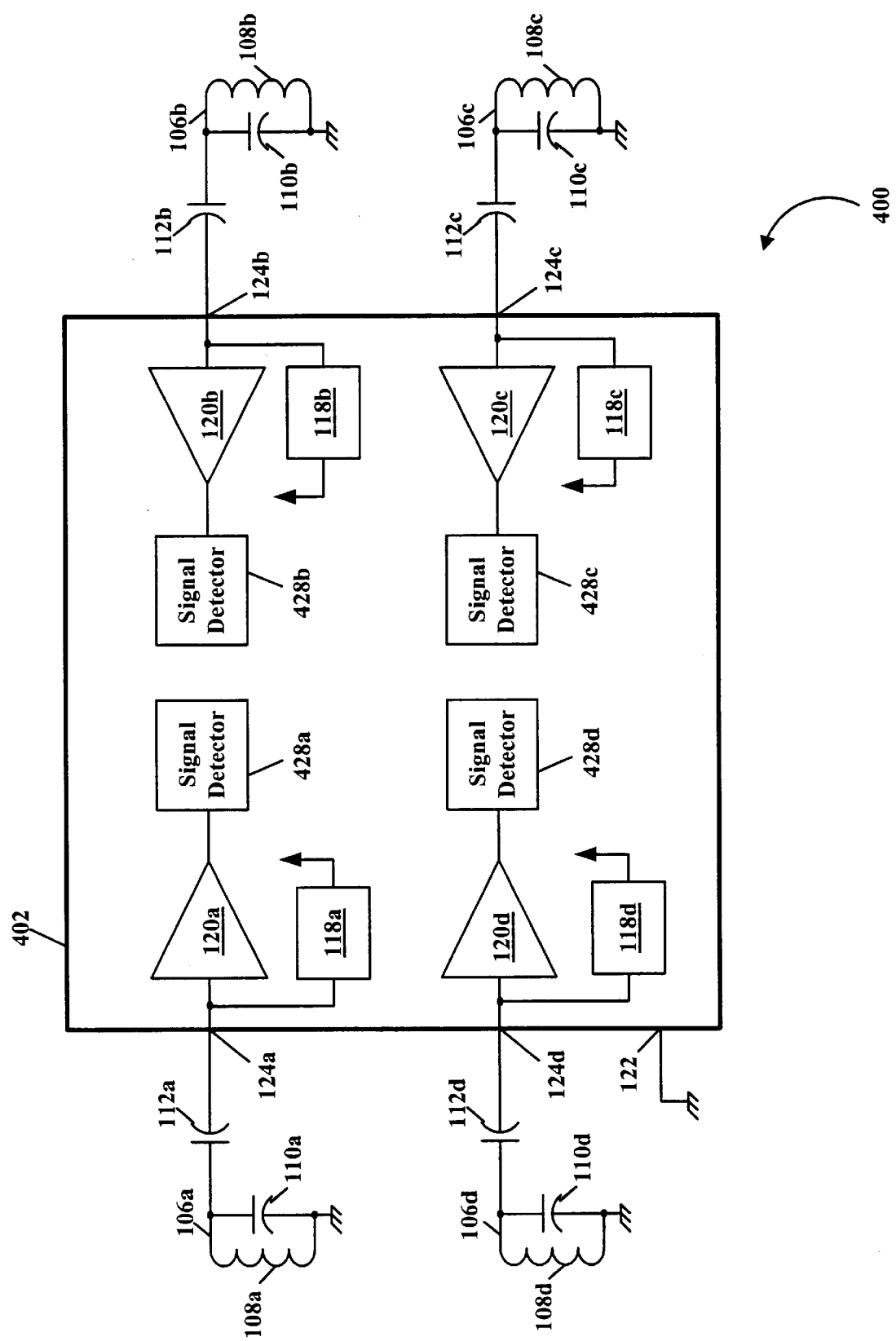
FIG. 4 is a schematic block diagram of a multiple channel embodiment of the invention.

Referring to FIG. 4, a schematic block diagram of a multiple channel embodiment of the invention is illustrated. A transponder having a plurality of signal inputs for a plurality of different channels is generally indicated by the numeral 400. According to this embodiment of the present invention, the transponder 400 comprises high gain signal amplifiers 120a–120d, DC bias level measurement and control circuits 118a–118d, (current sources 114a–114d and 116a–116d are not illustrated for clarity) and signal detectors 428a–428d in an integrated circuit package 402; parallel tuned circuits 106a–106d, and DC blocking capacitors 112a–112d connected between input-output pins 124a–124d of the integrated circuit package 402 and the parallel tuned circuits 106a–106d. The parallel tuned circuits 106a–106d comprise capacitors 110a–110d and inductors 108a–108d. The signal returns of the parallel tuned circuits 106a–106d are through a common power or ground pin 122 (ground pin illustrated). However, the use of a common power pin for a signal return is also contemplated and within the scope of the present invention).

The DC blocking capacitors 112a–112d allow independent DC bias levels to be set at the inputs of each of the amplifiers 120a–120d. The DC bias level measurement and control circuits 118a–118d control the current sources 114a–114d and 116a–116d (not illustrated), respectively, so that preferred DC bias values are applied to the amplifiers 120a–120d to optimize the available signal amplification thereof. The DC bias level measurement and control circuits 118a–118d can also control the gain of the amplifiers 120a–120d, respectively, by changing the respective DC bias values thereof. The amplification of the amplifiers 120a–120d may be optimized to receive signals of 1 millivolt or greater.

The parallel tuned circuits 106a–106d are adapted to receive electromagnetic or radio frequency (RF) energy from a plurality of signal sources which may be at different operating frequencies and contain independent information from each of the plurality of signal sources. The received energies are in the form of alternating current (AC) signals which are coupled through the blocking capacitors 112a–112d and amplified by the amplifiers 120a–120d. The amplified signals from the outputs of the amplifiers 120a–120d are detected (demodulated) in the signal detectors 428a–428d. The demodulated information signals from the signal detectors 428a–428d are processed in logic circuits (not illustrated). Four information channels are illustrated for clarity, however, it is contemplated and within the scope of the present invention that any number of information channels may be received and processed by an embodiment of the present invention.

The blocking capacitors 112a–112d each have an AC impedance substantially lower than the input impedance of the amplifiers 120a–120d. Thus, the blocking capacitors 112a–112d introduce very little attenuation of the received AC signals at the parallel tuned circuits 106a–106d.

Figure 5:
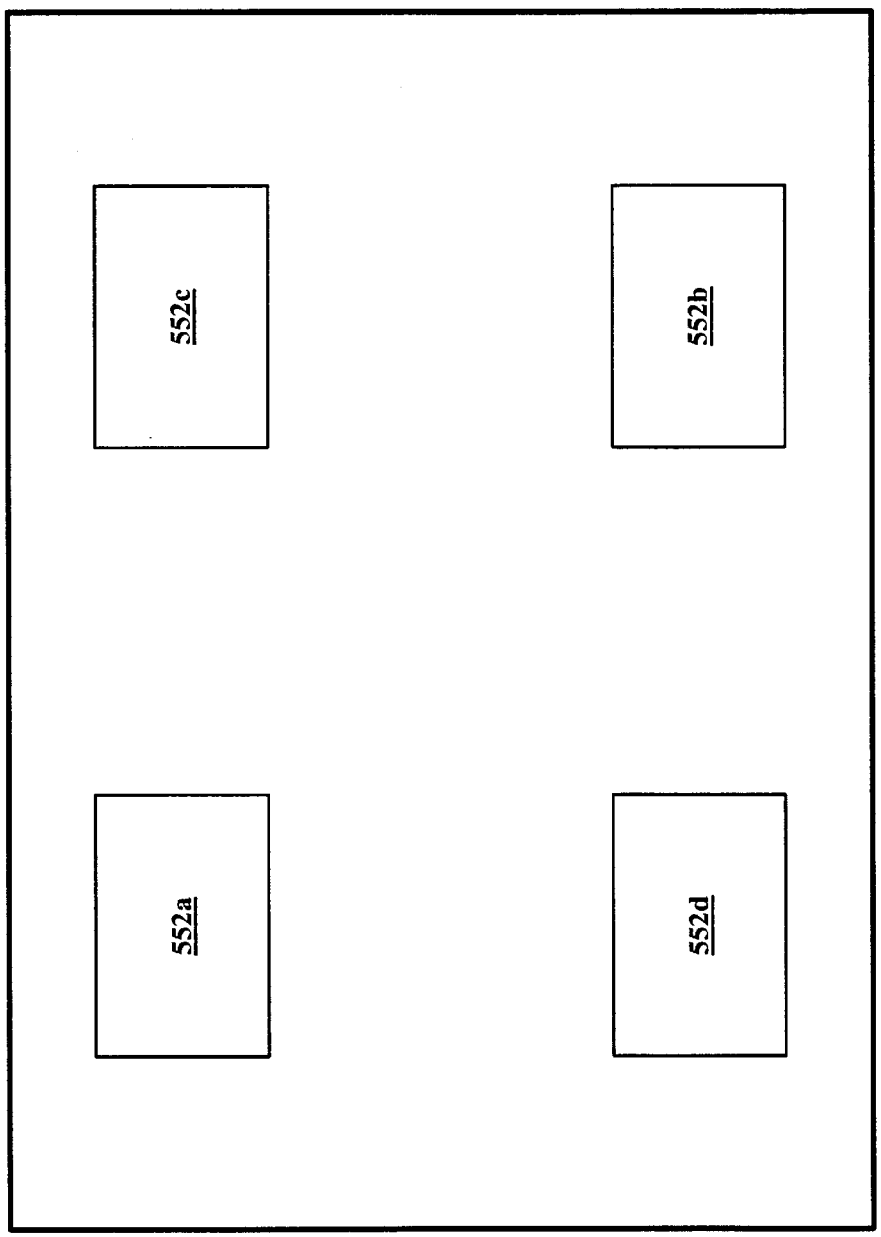
FIG. 5 is schematic diagram of a system utilizing the embodiments of the invention.

Referring now to FIG. 5, a schematic diagram of a system utilizing the embodiments of the invention is illustrated. A generally secured environment having an embodiment of the present invention is represented by the numeral 500. The environment 500 may be an automobile, office building, garage with a remotely controlled access gate, warehouse, boat, plane or train, i.e., anything which is secured by a locked entrance and allows access by authorized personnel. Signal pickup sensors 552a–552d represent herein the tuned parallel circuits 106a–106d, respectively, of the embodiments disclosed hereinabove. For example, a space diversity receiving system may be implemented using the embodiment illustrated in FIG. 3 and disclosed hereinabove, by placing the signal pickup sensors 552a–552d (tuned parallel circuits 106a–106d) at various locations on the environment 500. This space diversity system allows better reception of, for example but not limitation, a keyless entry system to the environment 500 no matter where the keyless transmitter is in relation to the environment 500. The signal pickup sensors 552a–552d(tuned parallel circuits 106a–106d) may also be utilized with the embodiment of the invention illustrated in FIG. 4 and disclosed hereinabove.

An example of a transponder security system which may benefit from the embodiments of the present invention is described more fully in the KEELOQ® (a registered trademark of Microchip Technology Inc.) products, and more specifically, in the device entitled "Code Hopping Encoder and Transponder," part number HCS412 by Microchip Technology Inc., more fully described in Specification DS41099A (1999) available at http://www.microchip.com, and incorporated by reference herein. The HCS412 requires two dedicated package pins for connection to a parallel tuned circuit, as illustrated in FIG. 2—2 of the HCS412 data sheet. The present invention maintains the functionality of the HCS412 but reduces the number of pins required for external connections to the integrated circuit package.

Figure 6:
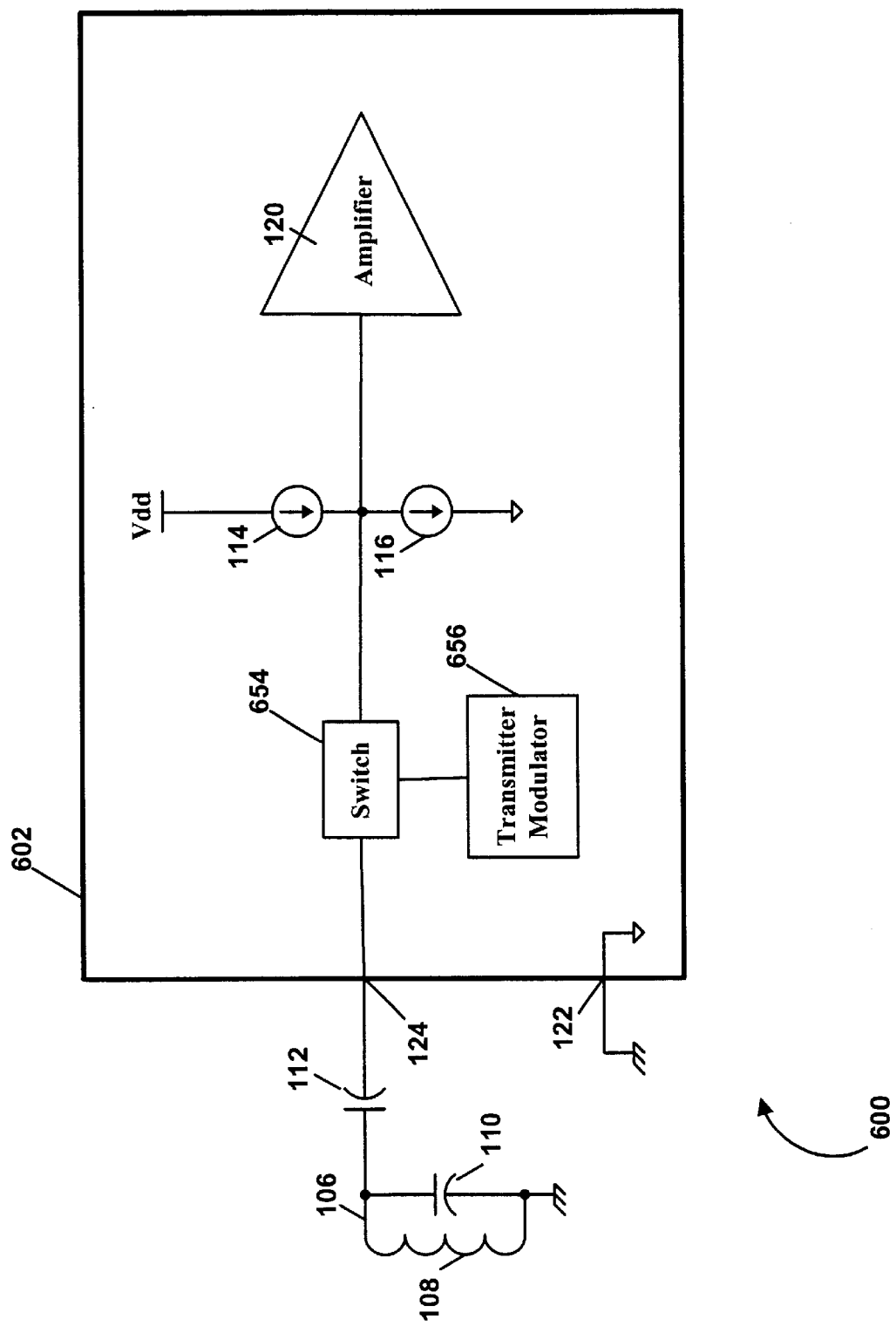
FIG. 6 is a schematic block diagram of the embodiment illustrated in FIG. 1, further comprising a radio frequency switch and transmitter-modulator using the same input-output pin as the receiver-amplifier.

Referring now to FIG. 6, a schematic block diagram of the embodiment illustrated in FIG. 1, further comprising a radio frequency switch and transmitter-modulator using the same input-output pin as the receiver-amplifier, is illustrated. The transponder embodiment of FIG. 6 is generally indicated by the numeral 600. The transponder 600 further comprises a switch 654, for example but not limitation, metal oxide field effect transistors (MOSFET) and a transmitter-modulator circuit 656 in the integrated circuit package 602. The switch 654 transfers connection of the input-output pin 124 to either the input of the amplifier 120 for receiving a signal picked up on the turned circuit 106, or to the transmitter-modulator 656 for transmitting a digitally encoded signal from the tuned circuit 106. Thus, the transponder function of interrogation and acknowledgement is performed by the transponder using the same pin 124 and tuned circuit 106 for an antenna.

It is also contemplated and within the scope of the present invention that a separate transmitting antenna and pin on the integrated circuit package may be used, i.e., the receiver and transmitter frequencies are different. The present invention allows better utilization of the fixed number of pins on an integrated circuit package, thus, enabling more features to be offered for a given integrated circuit package size.

The invention, therefore, is well adapted to carry out the objects and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving fill cognizance to equivalents in all respects.

What is claimed is:

1. A radio frequency transponder, comprising:

a radio frequency tuned circuit having a first and a second end;

a first capacitor;

an integrated circuit having a radio frequency amplifier, first and second current sources, and a bias control circuit;

said first and second current sources connected to said radio frequency amplifier for generating a bias level and controlling a gain thereof;

said bias control circuit connected to said first and second current sources for controlling the bias level;

said integrated circuit having a signal connection and a common connection;

an input of said radio frequency amplifier is connected to said signal connection;

said first capacitor is connected between the first end of said radio frequency tuned circuit and said signal connection; and the second end of said radio frequency tuned circuit is connected to said common connection.

2. The radio frequency transponder of claim 1, wherein said tuned circuit comprises an inductor and a second capacitor connected in parallel.

3. The radio frequency transponder of claim 1, wherein said first and second current sources are connected in series, and to the input of said radio frequency amplifier.

4. The radio frequency transponder of claim 3, wherein said first current source is connected to an operating voltage of the integrated circuit and said second current source is connected to the common connection of said integrated circuit.

5. The radio frequency transponder of claim 1, wherein said first capacitor impedance at a desired frequency is about one tenth the impedance of said radio frequency tuned circuit at the desired frequency.

6. The radio frequency transponder of claim 1, wherein said first capacitor impedance at a desired frequency is substantially less than the input resistance of said radio frequency amplifier.

7. The radio frequency transponder of claim 1, wherein said radio frequency tuned circuit is located a desired distance from said integrated circuit.

8. The radio frequency transponder of claim 1, further comprising:

a signal switch connected between said signal connection and the input of said radio frequency amplifier; and a transmitter-modulator connected to said signal switch, wherein said signal switch connects said transmitter-modulator to said signal connection and disconnects the input of said radio frequency amplifier from said signal connection when said transmitter-modulator is transmitting a signal.

9. A radio frequency transponder, comprising:

a radio frequency tuned circuit having a first and a second end;

a first capacitor;

an integrated circuit having a radio frequency amplifier, first and second current sources, and a bias control circuit;

said first and second current sources connected to said radio frequency amplifier for generating a bias level and controlling a gain thereof;

said bias control circuit connected to said first and second current sources for controlling the bias level;

said integrated circuit having a signal connection and a common connection;

an input of said radio frequency amplifier is connected to said signal connection; and said radio frequency tuned circuit and said first capacitor are connected so that said signal connection has no direct current path external to said integrated circuit.

10. The radio frequency transponder of claim 9, wherein said tuned circuit comprises an inductor and a second capacitor connected in parallel.

11. The radio frequency transponder of claim 10, wherein one end of the parallel connection of said inductor and said second capacitor are connected to said signal connection, and said first capacitor is connected between said common connection and another end of the parallel connection of said inductor and said second capacitor.

12. The radio frequency transponder of claim 9, wherein said tuned circuit comprises an inductor connected in series with said first capacitor and the series connection thereof is connected in parallel with a second capacitor.

13. A radio frequency transponder, comprising:

a plurality of radio frequency tuned circuits, each of said plurality of radio frequency tuned circuits having a first and a second end;

a plurality of first capacitors;

an integrated circuit having a plurality of radio frequency amplifiers, a plurality of first and second current sources, and a plurality of bias control circuits;

each of said a plurality of first and second current sources connected to a respective one of said a plurality of radio frequency amplifiers for generating bias levels and controlling gains thereof;

each of said plurality of bias control circuits connected to a respective one of said first and second current sources for controlling the bias levels thereof;

said integrated circuit having a plurality of signal connections and a common connection;

an input of each of said plurality of radio frequency amplifiers is connected to a respective one of said plurality of signal connections;

each of said plurality of first capacitors is connected between the first end of a respective one of said plurality of radio frequency tuned circuits and the respective one of said plurality of signal connections; and the second end of each of said plurality of radio frequency tuned circuits is connected to said common connection.

14. The radio frequency transponder of claim 13, wherein each of said plurality of tuned circuits comprises an inductor and a second capacitor connected in parallel.

15. The radio frequency transponder of claim 13, wherein said plurality of radio frequency tuned circuits are located a desired distance from said integrated circuit.

16. The radio frequency transponder of claim 13, further comprising:

a best signal selection circuit connected to signal outputs of said plurality of radio frequency amplifiers; and a signal detector connected to an output of said best signal selection circuit, wherein a best signal is selected of the outputs of said plurality of radio frequency amplifiers.

17. The radio frequency transponder of claim 13, wherein said plurality of radio frequency tuned circuits are tuned to the same frequency.

18. The radio frequency transponder of claim 13, wherein said plurality of radio frequency tuned circuits are tuned to different frequencies.

19. The radio frequency transponder of claim 13, further comprising a plurality of signal detectors, each one of said plurality of signal detectors connected to an output of a respective one of said plurality of radio frequency amplifiers.

20. An enclosed environment having access controlled by a wireless security device, said enclosed environment comprising:

a controlled access to the inside of the enclosed environment;

at least one radio frequency tuned circuit located on the enclosed environment and adapted to receive signals from a signaling device so as to control the controlled access to the enclosed environment;

an integrated circuit having at least one radio frequency amplifier and corresponding first and second current sources, a bias control circuit and a respective signal connection for each one of the at least one radio frequency amplifier, and a common connection, wherein the corresponding first and second current sources are connected to each one of the at least one radio frequency amplifier for generating a bias level and controlling a gain thereof, and the bias control circuit connected to the corresponding first and second current sources for controlling the bias level thereof;

an input of each one of the at least one radio frequency amplifier is connected to the respective signal connection; and at least one first capacitor, each one of the at least one first capacitor being connected between a one of the at least one radio frequency tuned circuit and the respective signal connection.

21. The enclosed environment of claim 20, wherein the enclosed environment is selected from the group consisting of a vehicle, an office building, a home, a parking garage, a vault, a plane, a boat and a train.

* * * * *